US008937361B2

(12) United States Patent
Oganesian et al.

(10) Patent No.: US 8,937,361 B2
(45) Date of Patent: Jan. 20, 2015

(54) BSI IMAGE SENSOR PACKAGE WITH VARIABLE-HEIGHT SILICON FOR EVEN RECEPTION OF DIFFERENT WAVELENGTHS

(75) Inventors: Vage Oganesian, Sunnyvale, CA (US); Belgacem Haba, Saratoga, CA (US); Ilyas Mohammed, Santa Clara, CA (US); Piyush Savalia, Santa Clara, CA (US); Craig Mitchell, San Jose, CA (US)

(73) Assignee: DigitalOptics Corporation, San Jose, CA (US)

( * ) Notice: Subject to any disclaimer, the term of this patent is extended or adjusted under 35 U.S.C. 154(b) by 29 days.

(21) Appl. No.: 13/114,243

(22) Filed: May 24, 2011

(65) Prior Publication Data
US 2012/0199926 A1 Aug. 9, 2012

Related U.S. Application Data

(60) Provisional application No. 61/439,107, filed on Feb. 3, 2011.

(51) Int. Cl.
*H01L 31/0232* (2014.01)
*H01L 27/146* (2006.01)

(52) U.S. Cl.
CPC .... *H01L 27/14625* (2013.01); *H01L 27/14632* (2013.01); *H01L 27/1464* (2013.01); *H01L 27/14645* (2013.01); *H01L 27/14687* (2013.01)
USPC ...................................................... 257/432

(58) Field of Classification Search
CPC ............... H01L 27/1464; H01L 27/14625; H01L 27/14632; H01L 27/14645; H01L 27/14687

USPC ..................................................... 257/E27.13
See application file for complete search history.

(56) References Cited

U.S. PATENT DOCUMENTS

| 3,617,753 A | 11/1971 | Kato et al. |
| 5,119,227 A | 6/1992 | Dawson et al. |

(Continued)

FOREIGN PATENT DOCUMENTS

| JP | 2006080457 A | 3/2006 |
| JP | 2009244862 A | 10/2009 |

(Continued)

OTHER PUBLICATIONS

I-Micronews—Advanced Packaging: 3D IC, WLP & TSV : Sony Backside Illuminated (BSI) CMOS Image, 2 pages, Jun. 2009.

(Continued)

*Primary Examiner* — Kimberly Rizkallah
*Assistant Examiner* — Alexander Belousov
(74) *Attorney, Agent, or Firm* — Haynes & Boone, LLP

(57) ABSTRACT

A microelectronic image sensor assembly for backside illumination and method of making same are provided. The assembly includes a microelectronic element having contacts exposed at a front face and light sensing elements arranged to receive light of different wavelengths through a rear face. A semiconductor region has a first thickness between the first light sensing element and the rear face and a second thickness between the second light sensing element and the rear face such that the first and second light sensing elements receive light of substantially the same intensity. A dielectric region is provided at least substantially filling a space of the semiconductor region adjacent at least one of the light sensing elements. The dielectric region may include at least one light guide.

36 Claims, 12 Drawing Sheets

(56) References Cited

U.S. PATENT DOCUMENTS

| | | | |
|---|---|---|---|
| 5,217,597 A * | 6/1993 | Moore et al. | 205/123 |
| 5,592,018 A | 1/1997 | Leedy | |
| 5,808,350 A | 9/1998 | Jack et al. | |
| 5,936,268 A | 8/1999 | Cockrum et al. | |
| 6,169,319 B1 * | 1/2001 | Malinovich et al. | 257/447 |
| 7,531,884 B2 | 5/2009 | Kim | |
| 7,638,852 B2 | 12/2009 | Hsu et al. | |
| 2005/0258351 A1 | 11/2005 | Ma | |
| 2006/0043519 A1 | 3/2006 | Ezaki | |
| 2006/0145223 A1 | 7/2006 | Ryu | |
| 2007/0152250 A1 | 7/2007 | Kim | |
| 2007/0164384 A1 * | 7/2007 | Maruyama et al. | 257/431 |
| 2007/0262364 A1 * | 11/2007 | Hsu et al. | 257/291 |
| 2008/0079108 A1 | 4/2008 | Hsu et al. | |
| 2008/0159658 A1 | 7/2008 | Yun | |
| 2008/0265349 A1 | 10/2008 | Kasano et al. | |
| 2009/0078939 A1 | 3/2009 | Yamazaki et al. | |
| 2009/0090988 A1 | 4/2009 | Ohgishi | |
| 2009/0096049 A1 | 4/2009 | Oshiyama et al. | |
| 2009/0284630 A1 | 11/2009 | Itonaga | |
| 2009/0294886 A1 | 12/2009 | Hsu et al. | |
| 2009/0295979 A1 * | 12/2009 | Matsuo et al. | 348/335 |
| 2009/0302409 A1 | 12/2009 | Qian et al. | |
| 2010/0067827 A1 | 3/2010 | Ozcan et al. | |
| 2010/0140733 A1 | 6/2010 | Lee et al. | |
| 2010/0148290 A1 | 6/2010 | Park | |
| 2010/0171191 A1 | 7/2010 | Lee | |
| 2010/0176475 A1 * | 7/2010 | Sano et al. | 257/432 |
| 2010/0193669 A1 | 8/2010 | Yamaguchi et al. | |
| 2010/0270636 A1 | 10/2010 | Huang et al. | |

FOREIGN PATENT DOCUMENTS

| | | |
|---|---|---|
| JP | 2010034141 A | 2/2010 |
| JP | 2010153658 A | 7/2010 |
| JP | 2010226126 A | 10/2010 |
| KR | 10-0278983 | 4/2000 |
| KR | 2000-0020864 A | 4/2000 |
| KR | 10-0658930 | 12/2006 |
| KR | 10-0660714 B1 | 12/2006 |
| KR | 20070061530 A | 6/2007 |
| KR | 20070109895 A | 11/2007 |
| KR | 10-0967648 | 6/2009 |
| KR | 2009-0068403 A | 6/2009 |
| KR | 20090068934 A | 6/2009 |
| KR | 20100109405 A | 10/2010 |

OTHER PUBLICATIONS

International Search Report Application No. PCT/US2011/035855, dated Sep. 26, 2011.
International Search Report Application No. PCT/US2011/035732, dated Nov. 9, 2011.
International Search Report Application No. PCT/US2011/035732, dated Aug. 30, 2011.
U.S. Appl. No. 13/020,328.
U.S. Appl. No. 13/111,258.

* cited by examiner

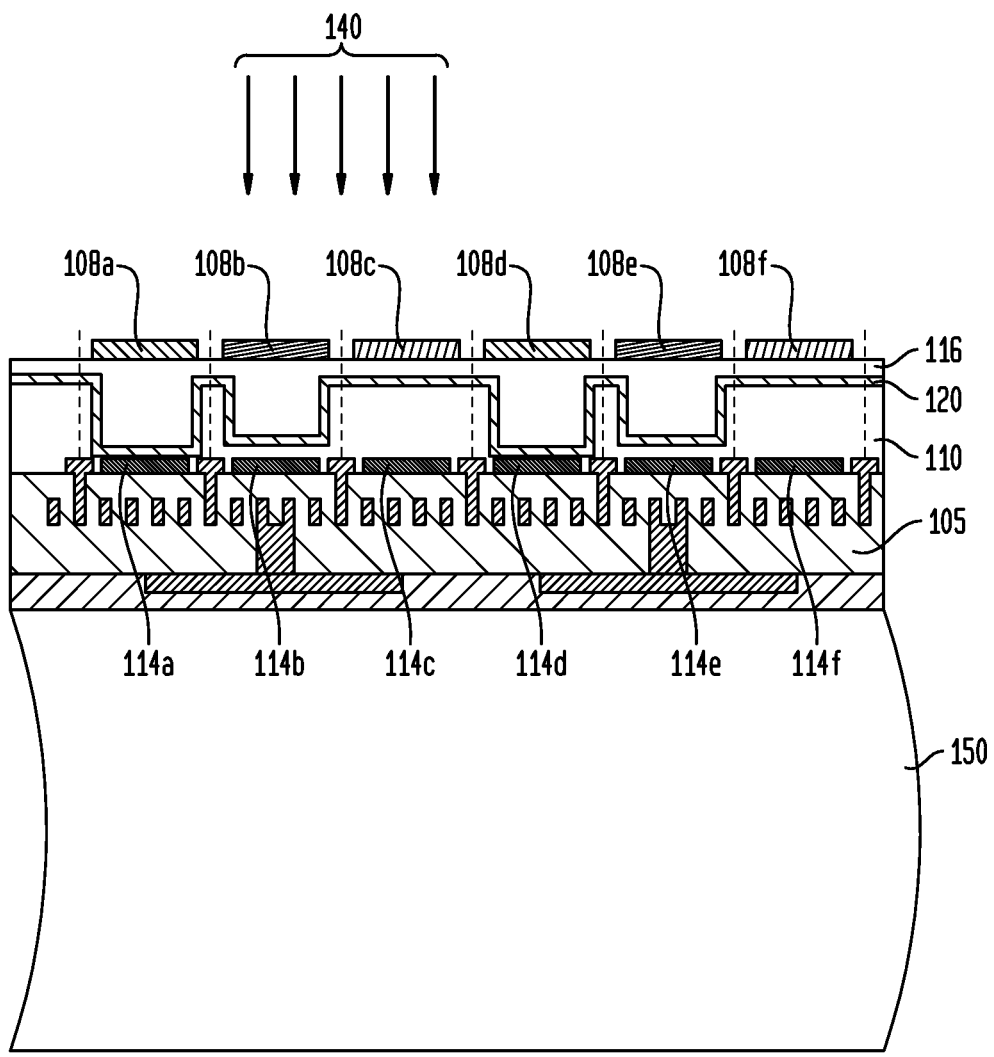

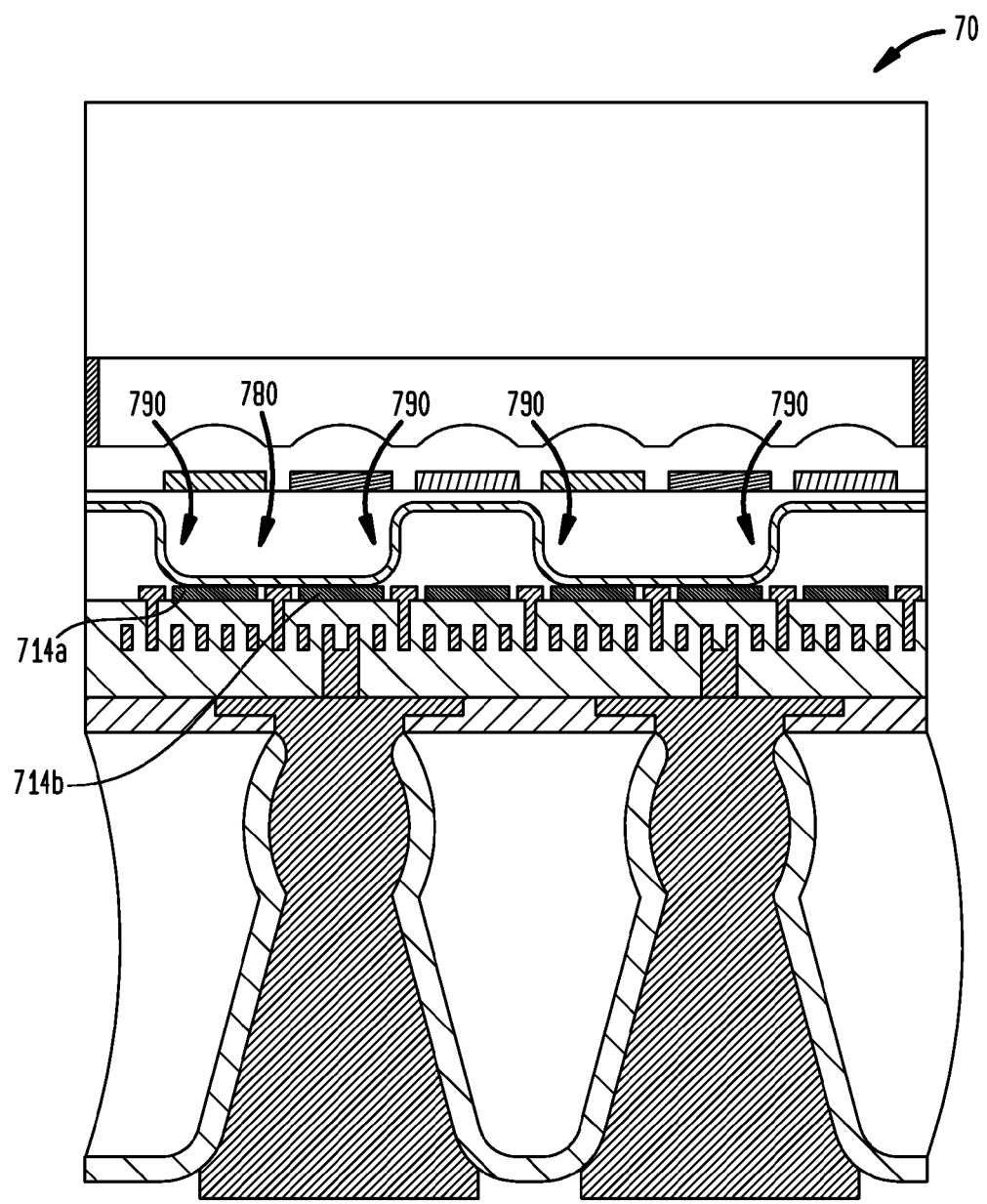

BSI IMAGE SENSOR PACKAGE WITH VARIABLE-HEIGHT SILICON FOR EVEN RECEPTION OF DIFFERENT WAVELENGTHS

CROSS-REFERENCE TO RELATED APPLICATIONS

This application claims the benefit of the filing date of U.S. Provisional Patent Application No. 61/439,107 filed Feb. 3, 2011, the disclosure of which is hereby incorporated herein by reference.

BACKGROUND OF THE INVENTION

The present invention relates to backside illuminated ("BSI") image sensors, and in particular, the formation of same for even reception of different wavelengths of light.

Image sensors attempt to capture incident light into signals that accurately record intensity and color information with good spatial resolution. Front side illuminated ("FSI") image sensors have photodetectors on silicon chips over which a circuitry layer including many levels of wiring is built up. In FSI image sensors, the light reaching the photodetectors must pass through the circuitry layer first. One limitation of FSI image sensors is that the circuitry layer can limit the exposed area, or aperture, of each pixel. As pixel sizes shrink in FSI image sensors due to increasing demands for higher numbers of pixels and smaller chip sizes, the ratio of pixel area to the overall sensor area decreases. This can reduce the quantum efficiency of the sensor.

This concern is addressed somewhat by backside illumination image sensors in which light enters the sensor from the back of the chip, thus avoiding the circuitry layer. However, in BSI image sensors, the light must still pass through the silicon that lies between the back of the chip and the photodetectors. This can also pose particular challenges, as will be further described herein. Further improvements can be made to BSI image sensors which may help to overcome deficiencies of current devices.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

BRIEF SUMMARY OF THE INVENTION

Embodiments of the invention herein can include a microelectronic element having a semiconductor region with a vary thickness overlying a plurality of light sensing elements therein. By varying the silicon thickness, the absorption of light by the silicon at each photodiode can be made more uniform for light of different wavelengths, such that the light sensing elements, e.g., photodiodes, receive light of different wavelengths at substantially the same intensity.

A first aspect of the present invention is a microelectronic image sensor assembly, including a microelectronic element having a front face, contacts exposed at the front face, a semiconductor region having a first surface adjacent the front face and the semiconductor region having a rear face remote therefrom, and first and second light sensing elements arranged to receive light of first and second different wavelengths, respectively, through the rear face. The semiconductor region has a first thickness between the first light sensing element and the rear face and a second thickness less than the first thickness between the second light sensing element and the rear face, the first and second thicknesses being selected such that the first and second different wavelengths are able to pass through the first and second thicknesses of the semiconductor region, respectively, and reach the first and second light sensing elements with substantially the same intensity. The microelectronic element further includes a dielectric region at least substantially filling a space within the semiconductor region overlying at least one of the first or second light sensing elements, wherein the microelectronic element has a substantially planar surface overlying the first and second light sensing elements, and a surface of the dielectric region is exposed at the substantially planar surface.

In accordance with certain embodiments of this first aspect, the dielectric region may be transparent to the light of the first and second different wavelengths. The dielectric region may have a refractive index greater than 1.8. The assembly may further include an antireflective coating overlying the rear face of the semiconductor region, wherein the dielectric region overlies the antireflective coating. A surface of the antireflective coating may be exposed at least a portion of the substantially planar surface. A surface of the dielectric region may be at least substantially co-planar with an exposed surface of the antireflective coating. The dielectric region may include a polymeric dielectric material. The first and second different wavelengths may correspond to different colors of light selected from the group consisting of red, blue, and green. A portion of the dielectric region may overlie the first light sensing element and such portion may be exposed at the substantially planar surface of the microelectronic element. A portion of the rear face of the semiconductor region may be exposed at the substantially planar surface and the dielectric region may be at least substantially co-planar with the portion of the rear face.

The assembly may further include a third light sensing element arranged to receive light of a third wavelength different from the first and second wavelengths through the rear face, wherein the semiconductor region has a third thickness between the third light sensing element and the rear face which is less than the second thickness, such that the third light sensing element is arranged to receive the light having the third wavelength with substantially the same intensity as the first and second light sensing elements are arranged to receive the first and second wavelengths, respectively. The first, second, and third wavelengths may correspond to different colors selected from the group consisting of red, blue, and green. The first wavelength of light may correspond to red light. The second wavelength of light may correspond to green light and the third wavelength may correspond to blue light, and the first thickness may be more than 5 times the third thickness and the second thickness may be at least 1.5 times the third thickness.

The dielectric region may include at least one light guide arranged in the space. The dielectric region may include at least one second light guide arranged in the space within the semiconductor region above the other of the first and second light sensing elements. The second thickness may be zero. The assembly may further include a substrate mounted to the front face of the microelectronic element, the substrate having a coefficient of thermal expansion of less than 10 parts per million/° C. ("ppm/° C."), and conductive elements extending from the contacts of the microelectronic element through the substrate and exposed at a surface of the substrate remote from the microelectronic element, the conductive elements including unit contacts. The assembly may further include a color filter array including at least a first filter and a second filter overlying the first and second light sensing elements, respectively, the first and second filters having first and second different passbands selecting the first and second wavelengths, respectively. The first and second wavelengths may correspond to different ones of: red, blue, or green wavelengths. The assembly may further include an array of microlenses including first and second microlenses overlying the first and second filters, respectively. The assembly may further include a transparent cover overlying the microlenses, a cavity being disposed between the transparent cover and the microlenses.

A second aspect of the present invention is a system including a structure as described above and one or more other electronic components electrically connected to the structure. In accordance with certain embodiments of this second aspect, the system may further include a housing, the structure and the other electronic components being mounted to the housing.

A third aspect of the present invention is a method of making a microelectronic image sensor assembly, including patterning a rear face of a semiconductor region of a microelectronic element having contacts exposed at a front face of the microelectronic element opposite the rear face, the microelectronic element having first and second light sensing elements adjacent the front face, the patterning performed such that the semiconductor region has a first thickness overlying the first light sensing element and a second thickness less than the first thickness overlying the second light sensing element, the first and second thicknesses being selected such that the first and second different wavelengths are able to pass through the first and second thicknesses of the semiconductor region, respectively, and reach the first and second light sensing elements with substantially the same intensity; and forming a dielectric region at least substantially filling a cavity in the semiconductor region overlying at least one of the first or second light sensing elements, wherein the microelectronic element has a substantially planar surface overlying the first and second light sensing elements, and a surface of the dielectric region is exposed at the substantially planar surface.

In accordance with certain embodiments of this third aspect, the method may further include forming an antireflective coating overlying the semiconductor region prior to the step of forming the dielectric region, wherein the dielectric region is formed over at least a portion of the antireflective coating. The first and second wavelengths may correspond to different colors of light selected from the group consisting of red, blue, and green. The step of patterning may include removing material from a portion of the rear face of the semiconductor region to form the cavity overlying at least the second light sensing element, the cavity extending from another portion of the rear face having the first thickness. A portion of the rear face of the semiconductor region may be exposed at the substantially planar surface and the dielectric region may be at least substantially co-planar with the portion of the rear face.

The microelectronic element may include a third light sensing element arranged to receive light of a third wavelength different from the first and second wavelengths through the rear face, wherein the step of patterning the semiconductor region may be performed such that the semiconductor region has a third thickness less than the second thickness between the third light sensing element and the rear face, such that the third light sensing element is arranged to receive the light having the third wavelength with substantially the same intensity as the first and second light sensing elements are arranged to receive the first and second wavelengths, respectively. The first, second, and third wavelengths may correspond to different colors selected from the group consisting of red, blue, and green. The step of forming the dielectric region may include forming at least one light guide in the cavity. The step of forming the dielectric region may further include forming at least one second light guide in the cavity in the semiconductor region adjacent the other of the first and second light sensing elements.

The method may further include mounting a substrate to the front face of the microelectronic element, the substrate having a coefficient of thermal expansion of less than 10 parts per million/° C. ("ppm/° C."), and forming conductive elements extending from the contacts of the microelectronic element through the substrate and exposed at a surface of the substrate remote from the microelectronic element, the conductive elements including unit contacts. The method may further include providing a color filter array including at least a first filter and a second filter overlying the first and second light sensing elements, respectively, the first and second filters having first and second different passbands selecting the first and second wavelengths, respectively. The first and second wavelengths may correspond to different ones of: red, blue, or green wavelengths. The method may further include forming an array of microlenses including first and second microlenses overlying the first and second filters, respectively. The method may further include mounting a transparent cover overlying the microlenses, a cavity being disposed between the transparent cover and the microlenses.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIGS. 7 and 8 are sectional views of the element of FIG. 6 having a color filter array.

FIG. 9C is a sectional view of another embodiment of a microelectronic image sensor assembly in accordance with the present invention.

DETAILED DESCRIPTION

Figure 1:
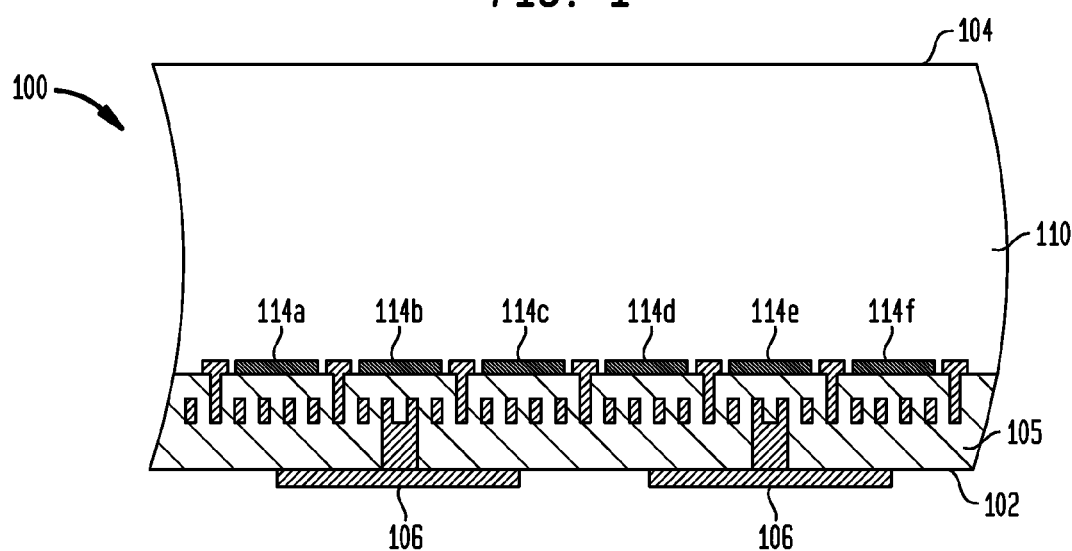
FIGS. 1-3 are sectional views of a microelectronic element in accordance with a first embodiment of the present invention.
Figure 2:
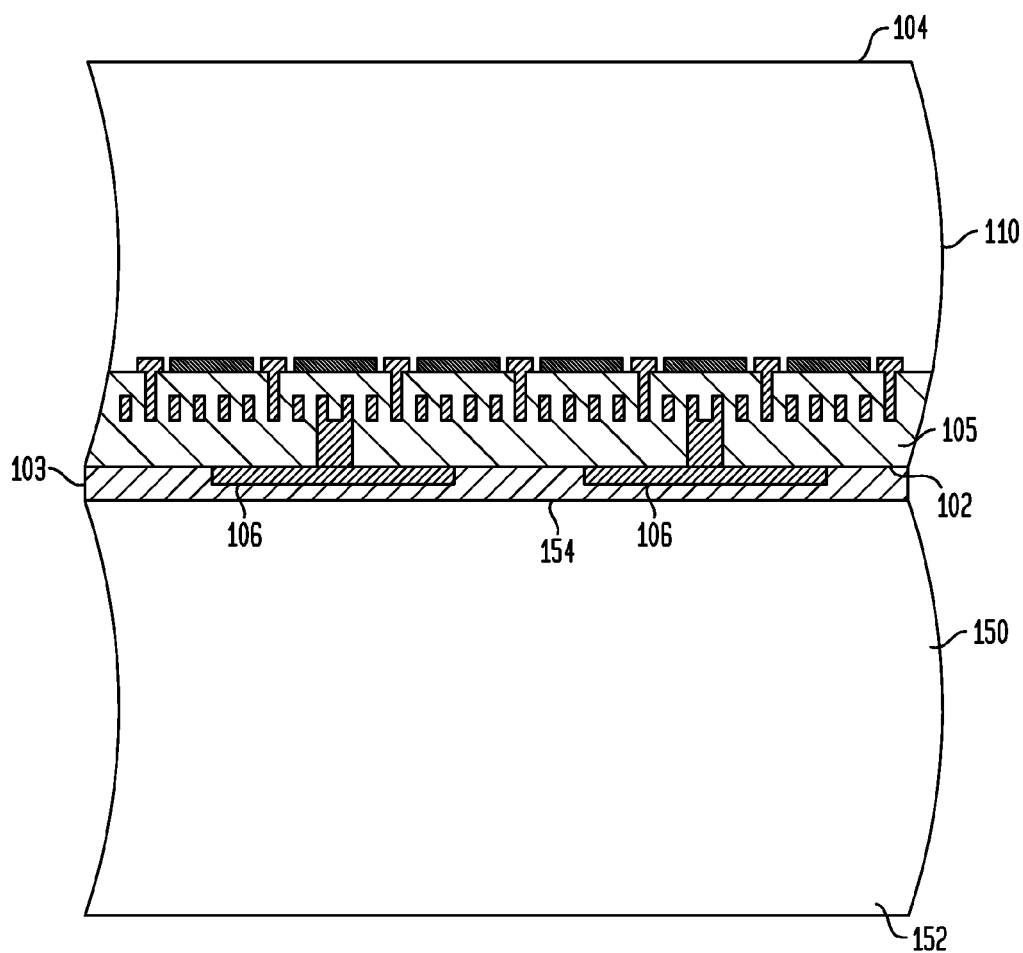

One particular challenge of designing BSI image sensors and assemblies incorporating them is to ensure that the light sensing elements therein adequately receive the different wavelengths of light for which they are designed to operate. In color BSI image sensors, some light sensing elements are arranged to sense blue light, while others sense red or green light. A particular challenge of color BSI image sensors is that the semiconductor material through which the light passes to reach the light sensing elements absorbs different wavelengths of light at substantially different rates. For example, silicon absorbs visible light in the blue wavelength range at a rate about five times the rate silicon absorbs visible light in the red wavelength range. Consequently, when a BSI image sensor has a uniform thickness of silicon overlying the light sensing elements, the light sensing elements which receive the blue light receive substantially lower intensity than the light sensing elements which receive the red light. Since the green wavelength range lies between blue and red, the light sensing elements which receive the green light receive substantially lower intensity than the light sensing elements which receive the red light.

Particular embodiments of the invention address these challenges. For example, FIGS. 1-9 depict various stages in formation of a microelectronic image sensor assembly 10 according to one embodiment of the present invention. In the embodiment shown in FIG. 9, a microelectronic image sensor assembly 10 is provided which includes a microelectronic element 100 having a front face 102 and a rear face 104 remote from front face 102. One or more contacts 106 are exposed at front face 102 of the microelectronic element. A circuitry portion 105 typically includes a plurality of wiring levels and provides electrical interconnection between internal elements within the microelectronic element 100 and between such internal elements and the contacts 106.

A plurality of light sensing elements ("LSEs") 114, i.e., 114a, 114b, 114c, 114d, 114e, and 114f as shown according to their respective positions in the assembly, are arranged to receive light through the rear face 104. Hereinafter, the LSEs at these positions may be collectively referred to as LSEs "114a-f". The LSEs typically are photodiodes but can be other types of photodetectors. Such devices typically are active circuit elements having at least portions formed in a semiconductor region 110 of the microelectronic element 100. The circuitry portion 105 provides interconnection between the LSEs and the contacts 106 so as to permit signals representing the output of the LSEs to be output via the contacts. Typically, the image sensor assembly 10 contains thousands or millions of LSEs, such that the arrangement seen in FIG. 9 can be repeated thousands or millions of times. As arranged within the microelectronic assembly, some of the LSEs are arranged to receive light of a first wavelength or first band of wavelengths, while other LSEs are arranged to receive light of a second wavelength of second band of wavelengths different from the first wavelength or first band. Still other LSEs can be arranged to receive light of a third wavelength or third band of wavelengths which is different from each of the first and second wavelengths or first and second bands.

In one embodiment, each of the LSEs can be identical and be designed to operate over a fairly wide range of wavelengths, and the microelectronic assembly 10 can include features which restrict the light that LSEs receive to narrower ranges of wavelengths or to particular wavelengths. For example, the assembly 10 can include a color filter array which includes filters 108a, 108b, 108c, 108d, 108e, and 108f (collectively, "108a-f") overlying respective ones of the LSEs 114a, 114b, 114c, 114d, 114e, and 114f. At least some of such filters 108a-f have different passbands which select corresponding different wavelengths. For example, filter 108a can have a passband which selects blue wavelength light, therefore selectively transmitting blue wavelength light while blocking the transmission of light for wavelengths other than blue wavelength. Similarly, filter 108b can have a passband which selects green wavelength light, and selectively transmits green wavelength light while blocking the transmission of light for wavelengths other than for green wavelength. Finally, filter 108c can have a passband which selects red wavelength light, and selectively transmits red wavelength light while blocking the transmission of light for wavelengths other than for red wavelength. There may be a small overlap or no overlap between the passbands of the filters. In the embodiment shown in FIG. 9, filters 108d, 108e and 108f may function similarly to filters 108a, 108b and 108c, respectively, such that filters 108a, 108d transmit blue wavelength light, filters 108b, 108e transmit green wavelength light and filters 108c, 108f transmit red wavelength light.

Figure 9:
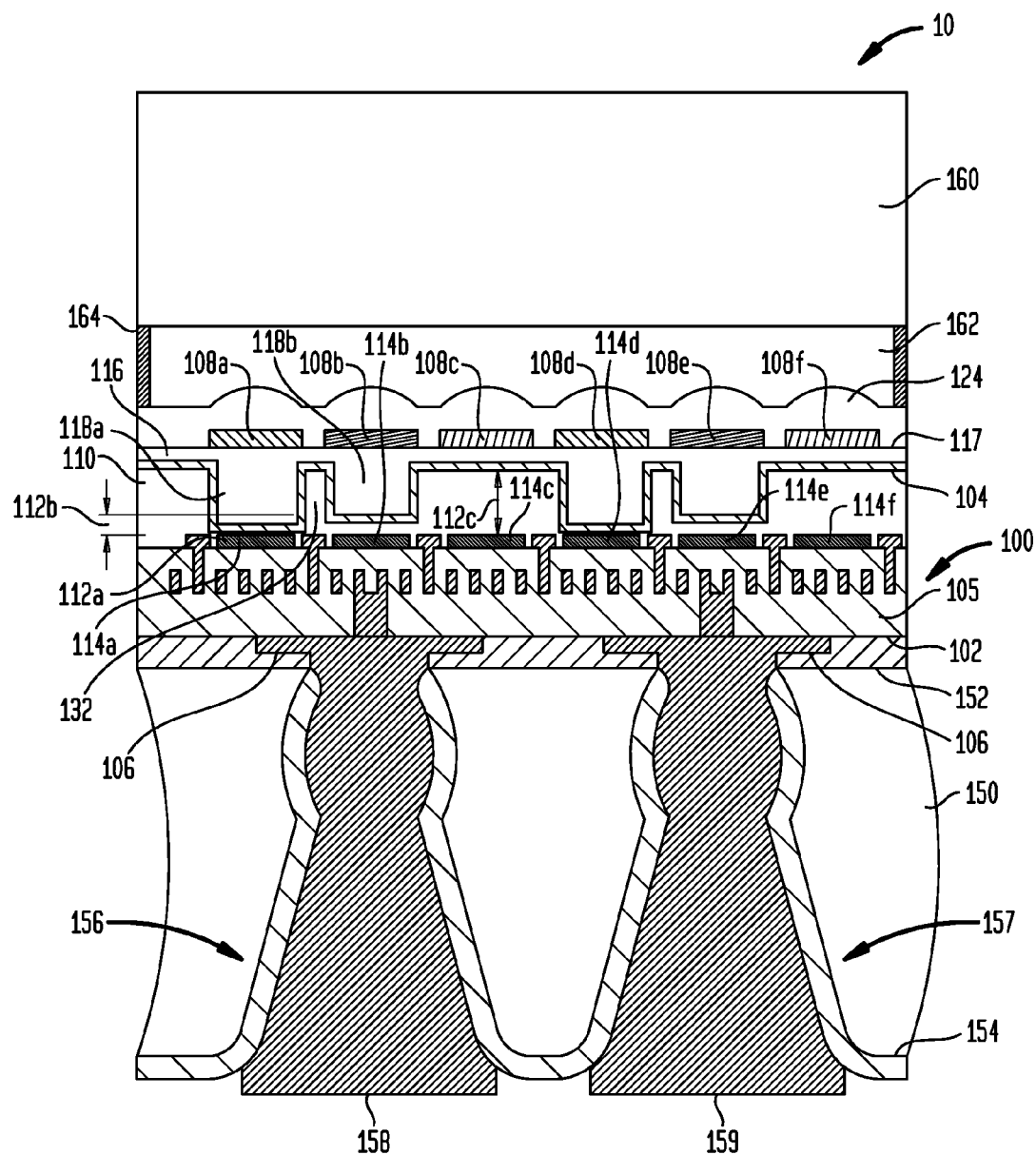
FIG. 9 is a sectional view of a microelectronic image sensor assembly including the element of FIG. 8.

In one embodiment, semiconductor region 110 may consist essentially of silicon. As seen in FIG. 9, the semiconductor region 110 has a rear face 104 which has features therein, such that the thickness of the semiconductor region 110 above respective LSEs varies, and the distance or height of the rear face 104 above the LSEs varies from one location to another. For example, the semiconductor region has a thickness 112b above LSE 114b, i.e., between LSE 114b and rear face 104, while the semiconductor region has a different thickness 112c between LSE 114c and rear face 104.

The different thicknesses 112b, 112c of semiconductor region 110 affect the light passing therethrough. By making the thickness of the semiconductor region 110 different, the greater absorption rate of shorter (e.g., blue) wavelengths by the semiconductor material, e.g. silicon, can be compensated by a corresponding decreased thickness of the silicon above the light sensing elements which receive the blue light.

As shown in FIG. 9, assembly 10 is constructed such that the thicknesses of semiconductor region 110, such as thicknesses 112b, 112c, can be defined by openings or cavities 118a, 118b patterned in the rear face 104. The openings can extend towards respective ones of the LSEs from substantially planar portions of the rear face which have the greatest thickness 112c. Thus, the thickness 112 above some LSEs, e.g., thickness 112c overlying LSE 114c, can be the thickness of the semiconductor region 110 at the substantially planar portion of the rear face from which the openings, e.g., openings 118a, 118b, extend. Above particular LSEs, e.g., LSE 114a and LSE 114d, most, or even substantially all, of the semiconductor region 110 between such LSE 114a and the rear face 104 may be removed, such that the thickness 112a may be at or close to zero.

Microelectronic element 100 further includes a dielectric region 116 at least substantially filling a space within semiconductor region 110 adjacent at least one of the LSEs 114. Thus, the openings or cavities 118a, 118b can be at least substantially filled by the dielectric region 116. Dielectric region 116 typically is transparent to the various wavelengths of light, e.g., red, green, and blue that the image sensor is designed to detect. In one embodiment, without limitation, the dielectric region can be formed of a polymeric dielectric material. In a particular embodiment, dielectric region 116 can have a refractive index greater than 1.8, which can help reduce reflection at an interface between the dielectric region 116 and the semiconductor region 110. As seen in FIG. 9, assembly 10 may include an antireflective coating 120 overlying semiconductor region 110, the antireflective coating separating the semiconductor region 110 from the dielectric region 116.

As discussed above, semiconductor materials such as silicon can absorb shorter wavelength light, e.g., blue light, at a much greater rate than red light. For example, the absorption rate of blue light in silicon is about five times the absorption rate of red light. In addition, the absorption rate of blue light in silicon is about 1.5 times the absorption rate of green light. To compensate for these differences in the absorption rate, when the semiconductor region 110 in the embodiment depicted in FIG. 9 consists essentially of silicon, the thickness 112c of the semiconductor region above the LSE 114c that receives red light can be about five times the thickness 112a of the semiconductor region above the LSE 114a that receives blue light, and the thickness 112b of the semiconductor region above LSE 114b that receives green light can be about 1.5 times the thickness 112a above the LSE 114a that receives blue light. Thus, red light that passes through filter 108c passes through a greater thickness of semiconductor region 110 than does the green light which passes through filter 108b. In addition, the green light passes through a greater thickness of semiconductor region 110 than does the blue light which passes through filter 108a. In this way, the products of the absorption rates of the semiconductor material for different wavelengths and the corresponding thicknesses of the semiconductor region can be made substantially equal, such that the intensity of light received by each LSE 114a-f can be substantially the same despite the differences in the wavelengths each LSE receives and despite the different absorption rates of the semiconductor material for each of the different wavelengths.

As an example, a silicon thickness of about 1 μm for blue, about 1.65 μm for green, and about 5.70 μm for red would yield a substantially constant absorption. Further, it has been determined that silicon thicknesses of about 0.625 μm for blue, about 1.03 μm for green, and about 3.56 μm for red would yield a substantially constant absorption of about 64 percent of light with about 36 percent of the light passing through the semiconductor region. The absorption coefficient for blue light (475 nm wavelength) is about 16,000/cm, for green light (510 nm wavelength) is about 9700/cm, and for red light (650 nm wavelength) is about 2810/cm.

Certain benefits can arise from such operation. With each LSE receiving substantially the same intensity of light as any other regardless of the wavelength, transmission becomes homogenized, with more uniform transmission of photons to the underlying photodiodes. Also, some light sensing elements, e.g., those arranged to receive blue light, can collect more photons without having to increase the area of the assembly. In one embodiment, any variation in the transmitted intensity of the light of different wavelengths, e.g., red, green, or blue wavelengths, to the respective LSEs, can be less than thirty percent across all the different wavelengths received by the LSEs. In a particular example, the variation in transmitted intensity to the LSEs of all the different wavelengths of light can be less than ten percent.

As further depicted in FIG. 9, front face 102 of microelectronic element 100 is mounted to a first surface 152 of a substrate 150. Substrate 150 preferably has a coefficient of thermal expansion of less than 10 parts per million/° C. ("ppm/° C."). A second surface 154 of substrate 150 is remote from first surface 152. Conductive vias 156, 157 extend from first surface 152 to second surface 154. The vias 156 can be aligned with contacts 106 exposed at front face 102 of microelectronic element 100 or in a variation thereof, may not be aligned with the contacts. Metal elements extend within vias 156, 157 to electrically connect contacts 106 with contact portions 158, 159 exposed at second surface 154 of substrate 150.

As further shown in FIG. 9, a microlens 124 of a microlens array can overlie each filter 108 and help to focus light onto a respective LSE 114. Overlying the microlenses 124 is a transparent cover 160 or other element comprised of glass or other transparent material. Incoming light passes through cover 160 prior to passing through microlenses 124 and being filtered according to different wavelengths by filters 108a-f. A cavity 162 is disposed between cover 160 and microlenses 124. Cavity 162 can be filled with air or gas. A supporting structure 164 can surround the cavity and support cover 160 above microelectronic element 100. In a particular embodiment, the transparent element 160 can have features (not shown) which allow it to serve an optical function, such as a refractive or diffractive optical element for the light which passes through it.

Figure 3:
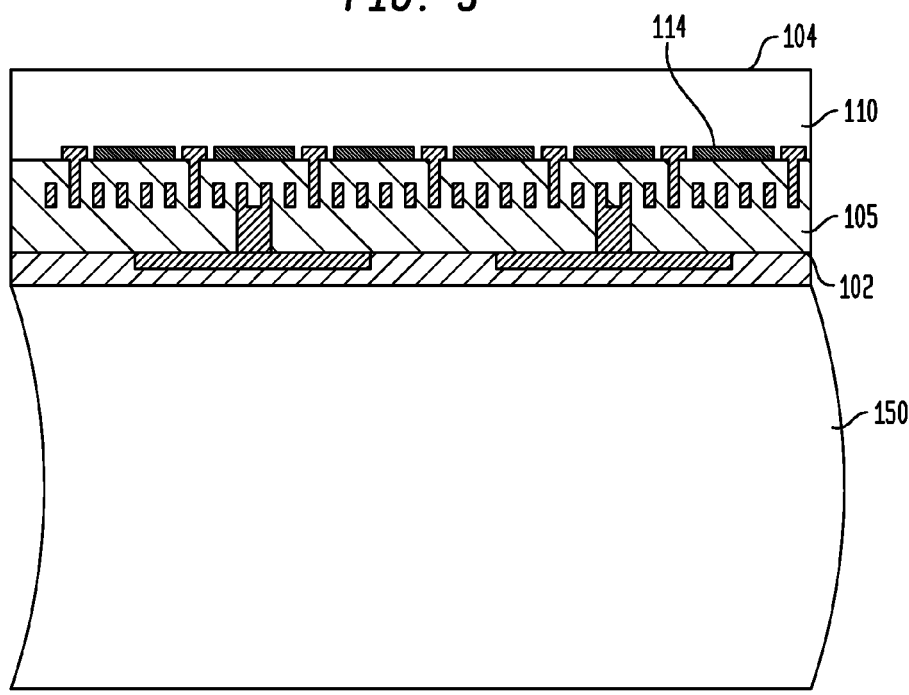

A method of making assembly 10 will now be described with reference to FIGS. 1-9. A microelectronic element 100 (FIG. 1), e.g., a wafer including semiconductor region 110, light sensing elements 114a-f, circuitry portion 105, and contacts 106 thereon, shown in FIG. 1, can be bonded to substrate 150 (FIG. 2), via an adhesive 103 or other dielectric material. Semiconductor region 110 can then be thinned, as shown in FIG. 3, such that the thickness of the semiconductor region which remains between LSEs 114 and the rear face 104 is now relatively small compared to the original thickness of the wafer as shown in FIG. 1.

Figure 4:
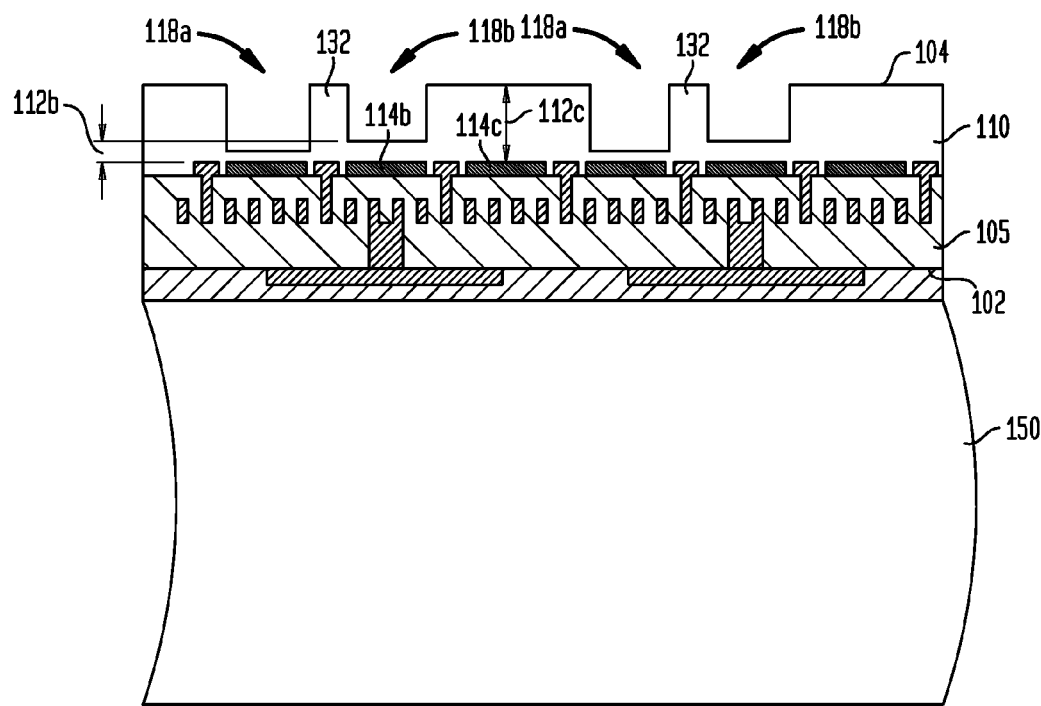
FIG. 4 is a sectional view of the element of FIGS. 1-3 having a patterned semiconductor region.

Then, as seen in FIG. 4, semiconductor region 110 is patterned, such as by etching, to form openings or cavities 118a, 118b in the rear face 104, such that the semiconductor region has thickness 112b overlying light sensing element 114b and thickness 112c overlying light sensing element 114c. In certain areas, the thickness 112c of the semiconductor region 110 remaining above some LSEs, e.g., LSE 114c, can be the thickness of the semiconductor region between openings in the rear face, e.g., the thickness 112c between opening 118b and opening 118a to the right of opening 118b in FIG. 4.

Figure 5:
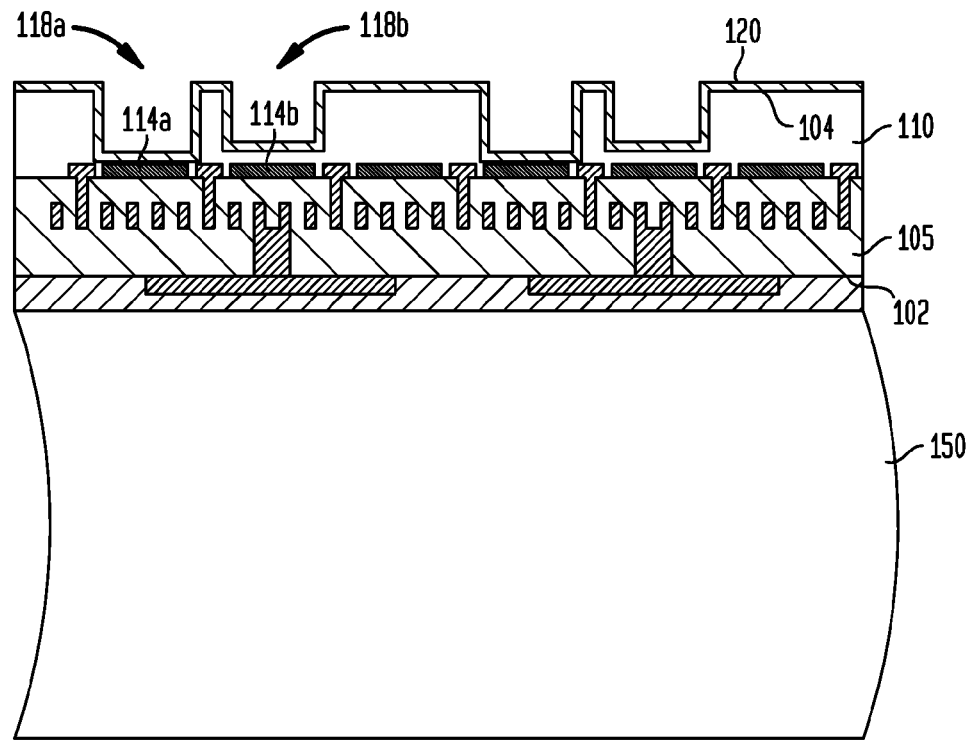
FIG. 5 is a sectional view of the element of FIG. 4 having an antireflective coating.

As shown in FIG. 5, antireflective coating 120 can be deposited over semiconductor region 110 such that it conformally covers the rear face 104, including the features therein, i.e. covering surfaces within the openings and portions of the rear face 104 between the openings. In a particular example, without limitation, the antireflective coating can be formed by sputtering.

Figure 6:
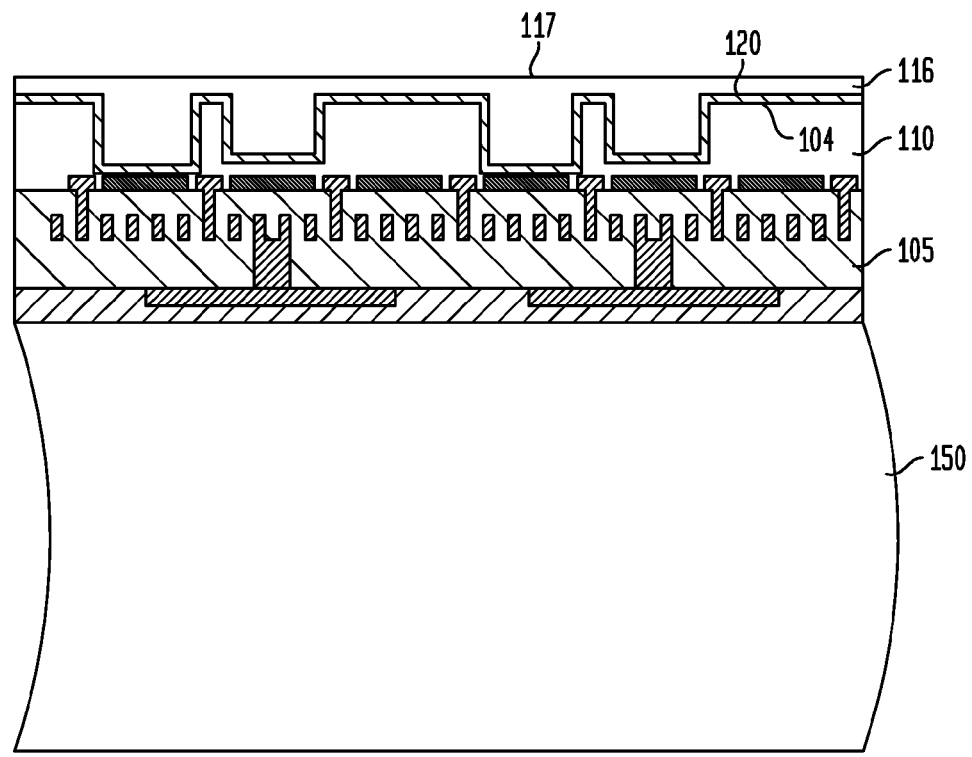
FIG. 6 is a sectional view of the element of FIG. 5 including a dielectric region.

As seen in FIG. 6, dielectric region 116 can be formed at least substantially filling the various cavities in semiconductor region 110 adjacent at least one of light sensing elements 114. The dielectric region 116 can be formed by spin coating, spray coating, screening, or other process. Dielectric region 116 can be formed to have an at least substantially planar major surface 117 overlying each of light sensing elements 114 and extending above the substantially planar portions of the rear face 104 between the openings. In such case, the surface 117 is a substantially planar surface of the microelectronic element.

Figure 6A:
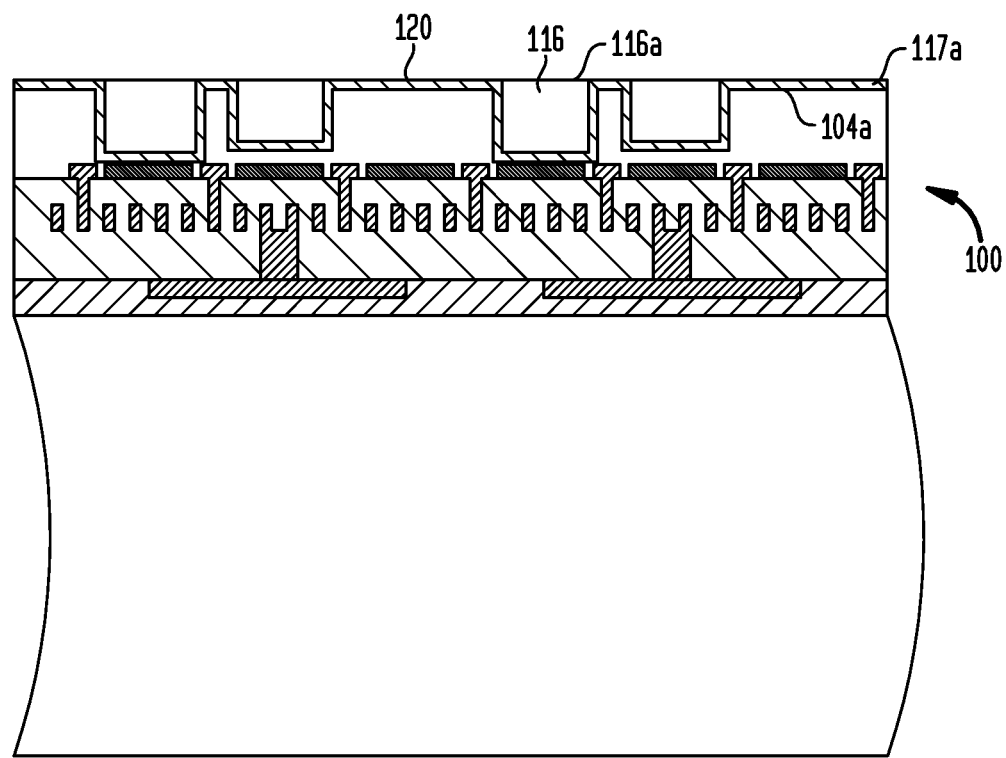
FIG. 6A is a sectional view of another embodiment of the element shown in FIG. 6.

Alternatively, as shown in FIG. 6A, the dielectric region 116 may be formed to fill the cavities and have a surface which is at least substantially co-planar with an exposed surface of the antireflective coating 120. In such case, the microelectronic element has a substantially planar surface 117a at which portions of the antireflective coating 120 and the dielectric region 116 can be exposed. Still referring to FIG. 6A, in another variation, the antireflective coating 120 may not be present at a portion 104a of the rear face, and such portion 104a can be exposed at a substantially planar surface 117a of the microelectronic element 100. The surface 116a of the dielectric region 116 can be exposed and at least substantially planar with the exposed portion 104a of the semiconductor region.

FIG. 7 illustrates the formation of a color filter array above the LSEs including filters 108a, 108b, 108c, etc., above respective ones of LSEs 114a, 114b, 114c, etc. The filters are exposed at or above the substantially planar surface 117 of the microelectronic element 100.

Figure 8:
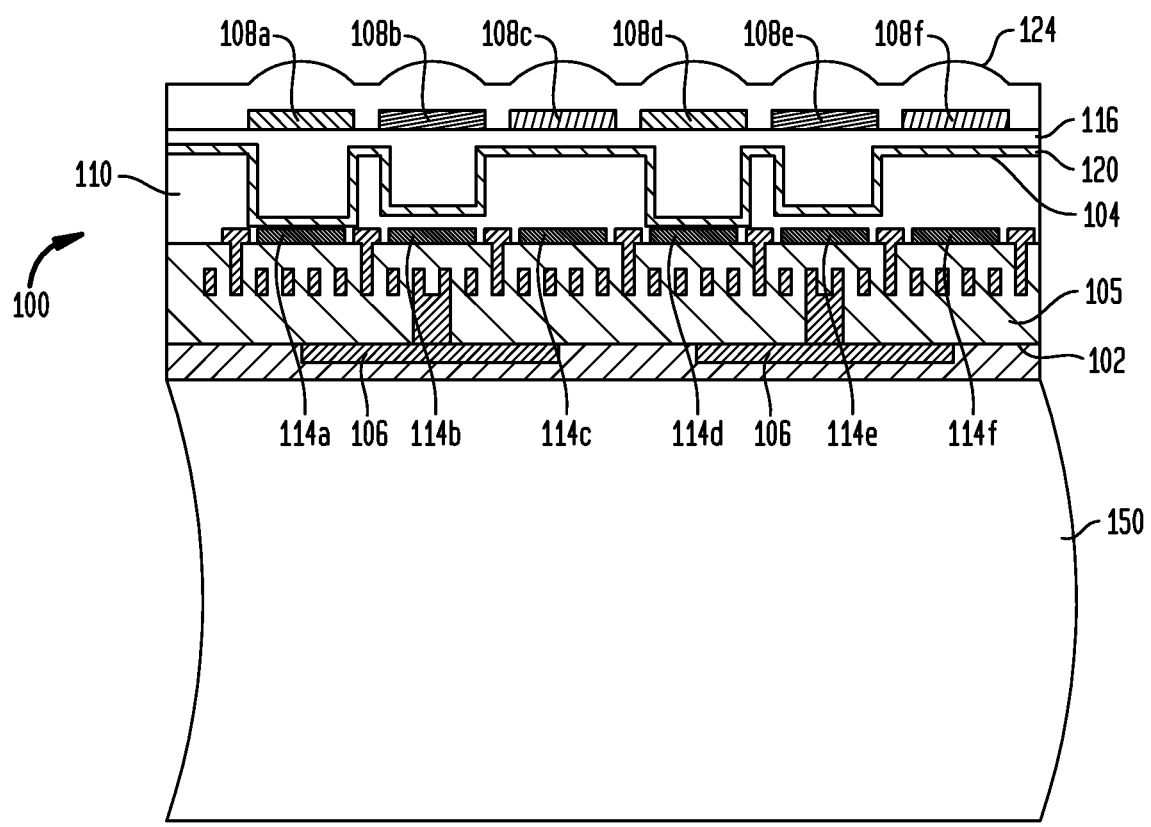

FIG. 8 illustrates the addition of an array of microlenses including microlens 124 overlying a respective LSE of the array of LSEs 114a-f. In further processing (FIG. 9), a wafer-sized transparent cover or other element 160 can be mounted above the rear face 104 of the wafer and be supported thereon by supporting structure 164. Conductive elements 158, 159 can be formed which extend from contacts 106 and are exposed at an exterior face 154 of the microelectronic assembly 110. A method of forming the conductive elements can be as described in one or more of the following commonly owned applications, the disclosures of which are incorporated herein by reference: U.S. Publication No. 2008/0246136 and U.S. Application Nos. 61/419,033 and 61/419,037. When a wafer-level fabrication method is used to produce the structure shown in FIG. 9 as contemplated in one embodiment herein, the structure at this stage of fabrication can include a device wafer including a plurality of microelectronic elements 100, a transparent cover element 160 or transparent wafer overlying the substantially planar surfaces of the microelectronic elements therein, and a carrier wafer, passive wafer or other substrate 150 overlying the front face 102 of the device wafer. The structure can be severed into a plurality of individual microelectronic assemblies 10, each including a microelectronic element 100, a transparent element 160 supported above the rear face of such microelectronic element, and a portion of the substrate 150 overlying the front face of such microelectronic element 100.

Figure 9A:
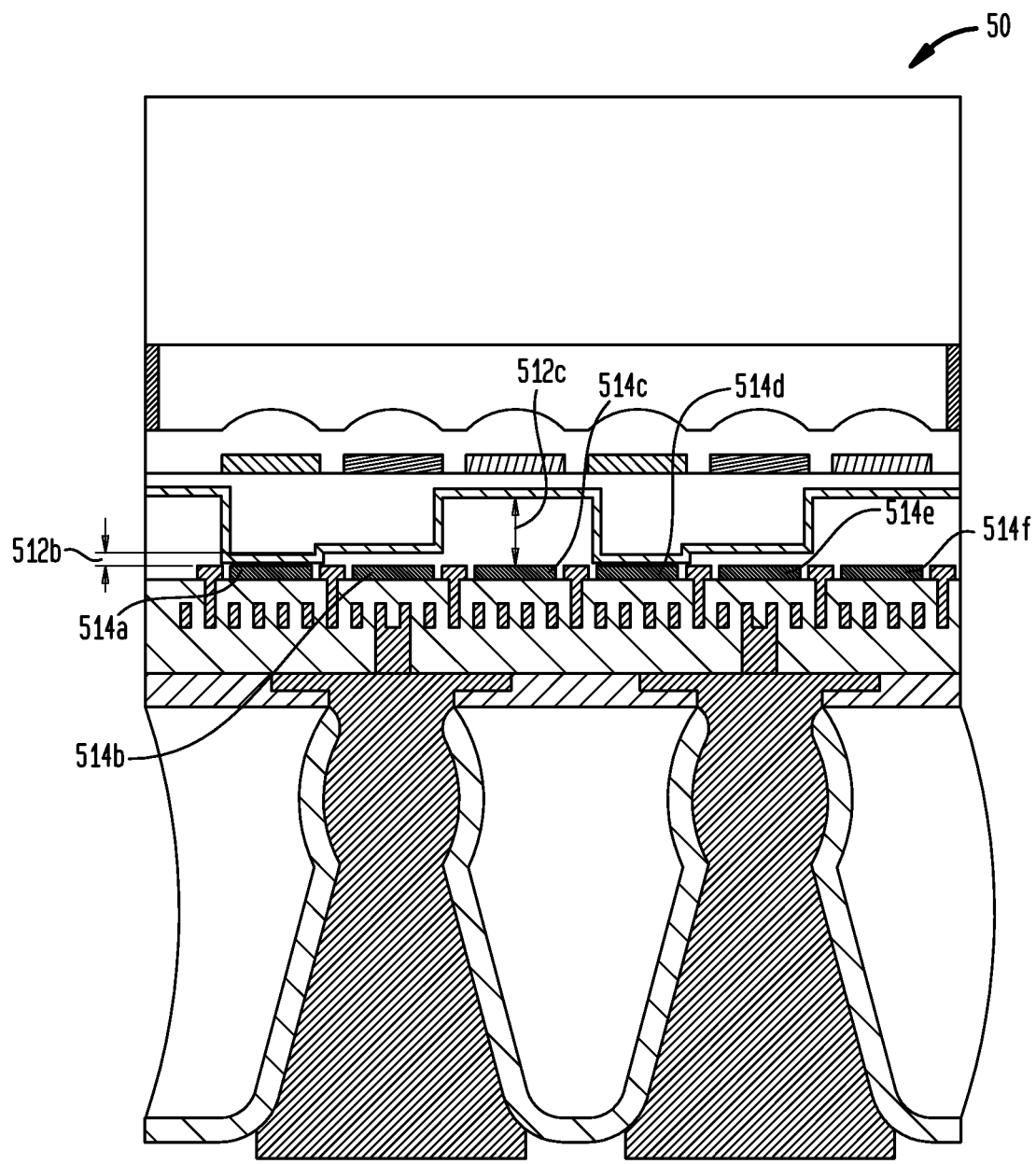
FIG. 9A is a sectional view of another embodiment of a microelectronic image sensor assembly in accordance with the present invention.

As seen in FIG. 9, areas, i.e., portions of the semiconductor region of different thicknesses 112, can be separated by a wall portion 132 having greater thickness than the thicknesses 112a, 112b in the adjacent openings. In the variation of the embodiment shown in FIG. 9A, an assembly 50 has elements 514a-f and different thicknesses 512 but omits the wall portions that separate openings such as wall portions 132 (FIG. 9).

Figure 9B:
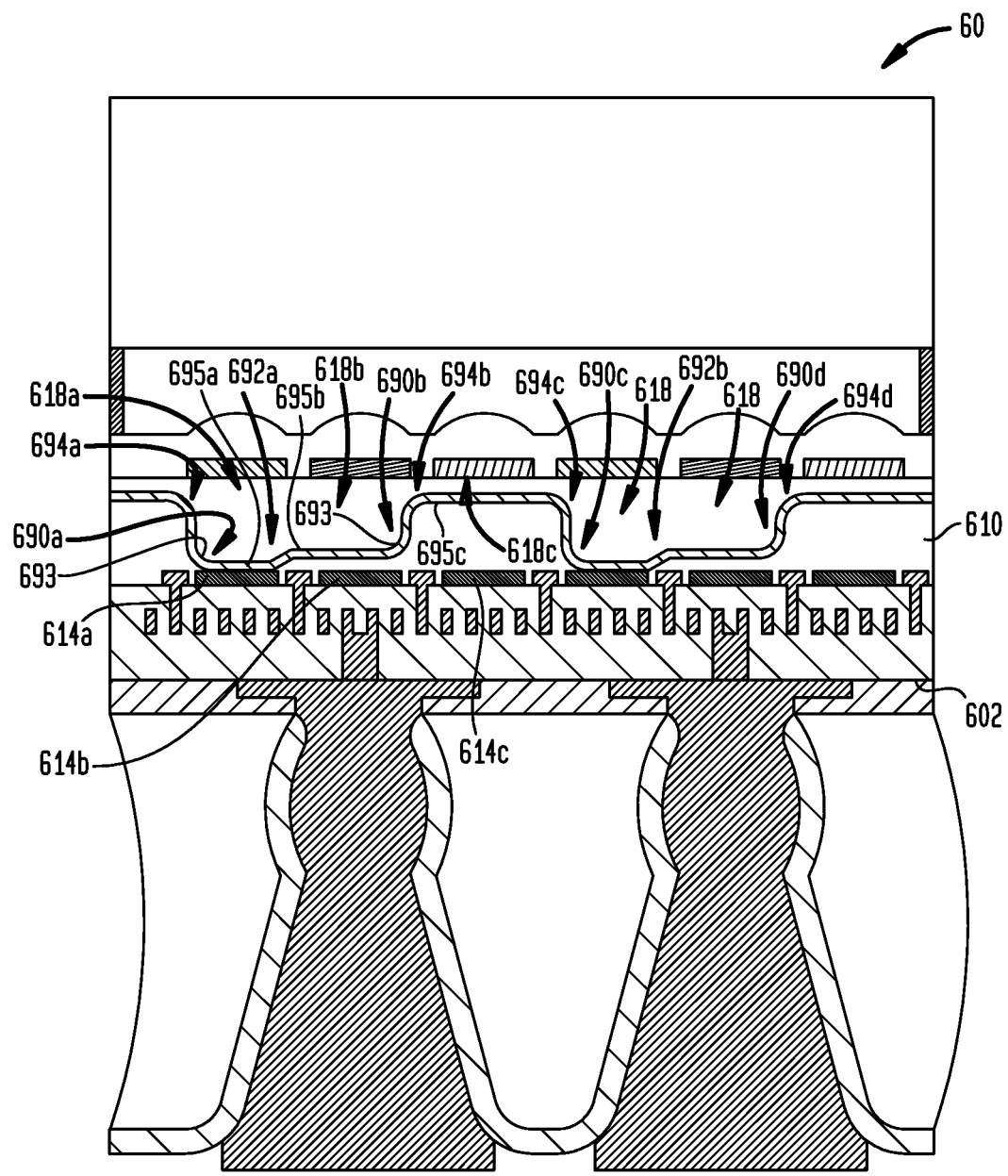
FIG. 9B is a sectional view of another embodiment of a microelectronic image sensor assembly in accordance with the present invention.

In another embodiment depicted in FIG. 9B, an assembly 60 includes a semiconductor region 610 having rounded portions 690 and a slanted surface 692 between the differently dimensioned openings 618. The rounded portions 690 can be radiused so as to define continuous transitions between walls 693 of the openings and bottom surfaces 695a, 695b. In this way, sharp edges can be eliminated between the walls and the bottom surfaces, which may improve device performance or reliability. Such rounded portions may make manufacture of assembly 60 easier, and may result from the etching process. In other embodiments, the surfaces at the bottom of openings 618 may be slanted with respect to the underlying light sensing elements 614. For example, a bottom surface 695a of opening 618a can extend between rounded portion 690a and slanted surface 692a. A bottom surface 695b of opening 618b can extend between slanted surface 692a and rounded portion 690b, and a bottom surface 695c of opening 618c can extend between rounded portions 694b and 694c. Any or all of bottom surface 695a-c may be slanted with respect to front face 602. The angle of inclination between a bottom surface 695 and the front face 602 may be the same as or different from an angle of inclination of an adjacent surface. Preferably, in an embodiment with slanted or angled bottom surfaces 695, the angles are calculated and manufactured such that the total amount of absorption across bottom surface 695 is equivalent to the absorption in an embodiment such as assembly 60.

In another embodiment depicted in FIG. 9C, an assembly 70 can have openings overlying two or more light sensing elements 714 patterned to substantially the same depth. Such may be the case where the wavelengths of light associated with such adjacent elements are similar, or are near enough in range so as to still provide for relatively even absorption among such elements with other elements in the assembly. For example, the absorption rates of blue and green light in silicon are similar, with blue being absorbed at about 1.5 times the rate that green is absorbed. Therefore, a single opening 780 having uniform depth can be formed overlying the LSEs 714a, 714b which receive blue and green light, respectively, such that the semiconductor region has the same thickness over both LSEs 714a, 714b. Rounded portions 790 of the openings 780 may be present at the step increases and decreases in height.

Figure 10:
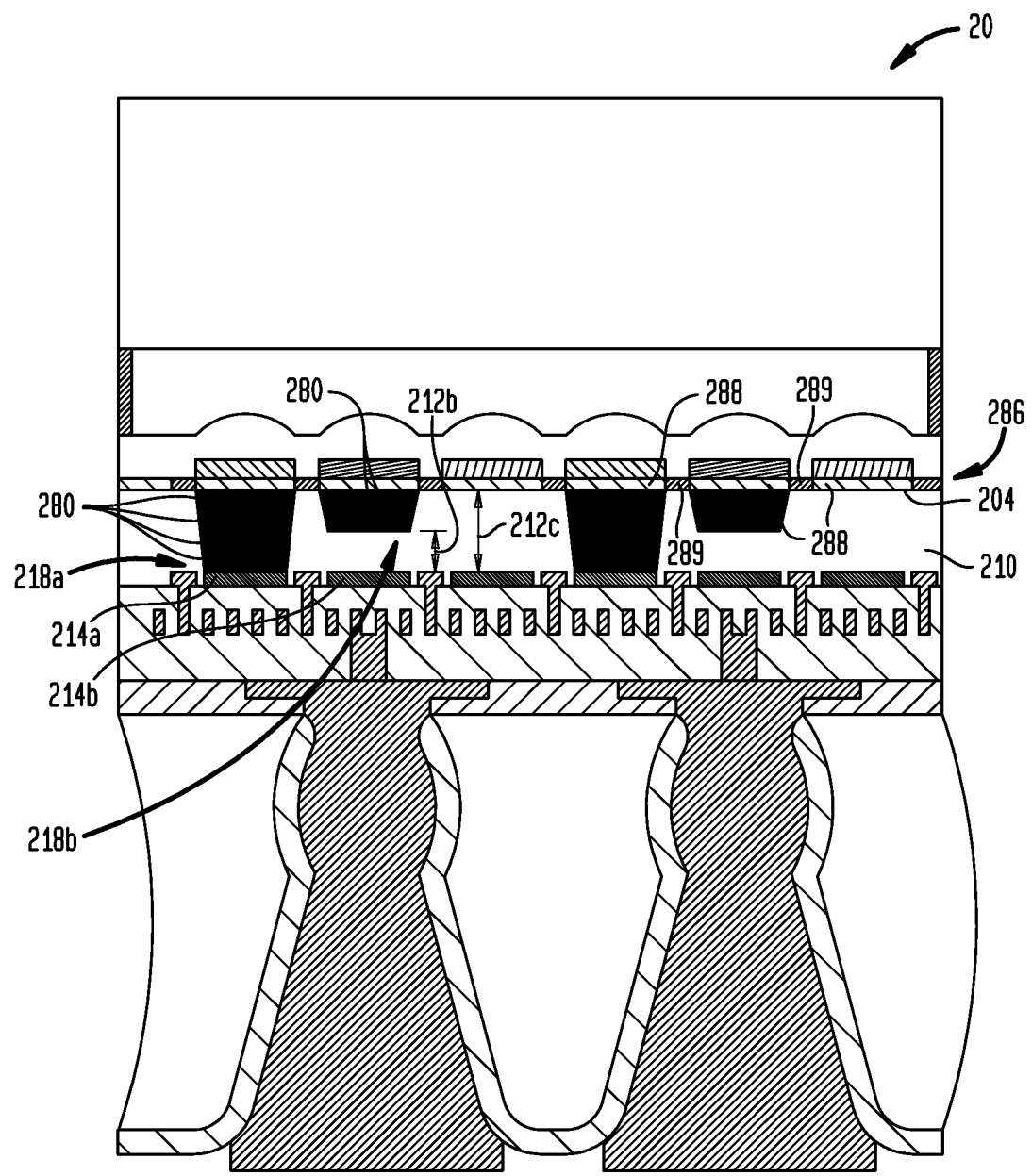
FIG. 10 is a sectional view of another microelectronic image sensor assembly in accordance with an embodiment of the present invention including a plurality of light guides.

FIG. 10 depicts a microelectronic image sensor assembly 20 according to a second embodiment of the present invention. Assembly 20 is similar in nearly all respects as assembly 10 as described above. However, the main difference is that dielectric region 116 of assembly 10 is replaced with a dielectric region comprised of one or more light guides 280 disposed in each opening 218 between any of thicknesses 212 of semiconductor region 210 and rear face 204. Light guides pass or direct incoming light in an axial direction normal to a face of the microelectronic element, and reduce scattering relative to other structures without light guides. Light guides 280 may be formed by filling the openings 218 with a dielectric material having a higher refractive index than other materials adjacent thereto. In one, the refractive index of the light guides can be 1.8 or higher. Also shown in FIG. 10, a metal grid 286 is arranged to overlie the rear face 204. Metal grid 286 typically defines apertures 288 overlying each LSE 214 to allow light to pass through grid 286 via apertures 288 and pass through light guides 280 to reach each respective LSE 214. Portions 289 of grid 286 are comprised of metal and are arranged to block transmission of light between spaces overlying adjacent LSEs 214. Portions 289 serve to reduce or substantially eliminate cross-talk of the passing light between adjacent LSEs 214.

Figure 11:
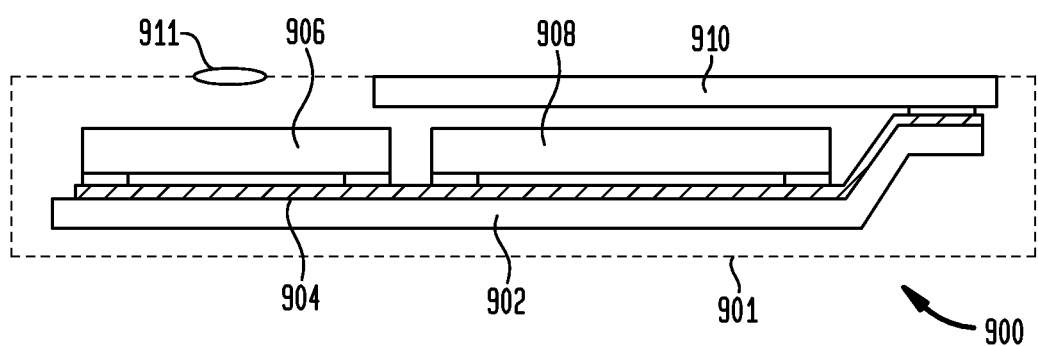
FIG. 11 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 11 for clarity of illustration, the system may include any number of such components. The structure 906 as described above may be, for example, a composite chip as discussed above or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 11, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 908 includes a light-sensitive element such as an imaging chip, a lens 911 or other optical device also may be provided for routing light to the structure. Again, the simplified system shown in FIG. 11 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of embodiments should be taken by way of illustration rather than by way of limitation of the invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic image sensor assembly, comprising:
a microelectronic element having a front face, contacts exposed at the front face, a semiconductor region having a first surface adjacent the front face and the semiconductor region having a rear face remote therefrom, and substantially identical first and second light sensing elements arranged on a planar circuitry portion of the semiconductor region to receive light of first and second different wavelengths, respectively, through the rear face,
wherein the semiconductor region has a first portion having a first thickness between the first light sensing element and the rear face and a second portion having a second thickness less than the first thickness between the second light sensing element and the rear face, the first and second thicknesses being selected such that the light of the first and second different wavelengths are able to pass through the first and second portions of the semiconductor region, respectively, and reach the first and second light sensing elements with substantially the same intensity, and wherein the planar circuitry portion is disposed between the light sensing elements and the front face and is configured to electrically couple the light sensing elements to the contacts;
the microelectronic element further including a dielectric region at least substantially occupying a space within the semiconductor region overlying at least one of the first or second light sensing elements, wherein the microelectronic element has a substantially planar surface overlying the first and second light sensing elements, and a surface of the dielectric region is exposed at the substantially planar surface; and
the semiconductor region further including a wall portion disposed between the first and second portions of the semiconductor region, the wall portion having a wall thickness overlying a level of the semiconductor region defined by the first and second light sensing elements, the wall thickness being greater than the first and second thicknesses and extending from the planar circuitry portion of the semiconductor portion to the rear face at the thickest portion of the semiconductor region, and the wall portion being continuous and consisting of a single material of the semiconductor region, separate from the light sensing elements, from a first outermost surface of the wall portion closest to the first portion to a second outermost surface of the wall portion closest to the second portion.

2. The assembly of claim 1, wherein the dielectric region is transparent to the light of the first and second different wavelengths.

3. The assembly of claim 2, wherein the dielectric region has a refractive index greater than 1.8.

4. The assembly of claim 1, further comprising an antireflective coating overlying the rear face of the semiconductor region, wherein the dielectric region overlies the antireflective coating.

5. The assembly of claim 4, wherein a surface of the anti-reflective coating is exposed at least a portion of the substantially planar surface.

6. The assembly of claim 5, wherein a surface of the dielectric region is at least substantially co-planar with an exposed surface of the antireflective coating.

7. The assembly of claim 1, wherein the dielectric region includes a polymeric dielectric material.

8. The assembly of claim 1, wherein the first and second different wavelengths correspond to different colors of light selected from the group consisting of red, blue, and green.

9. The assembly of claim 1, wherein a portion of the dielectric region overlies the first light sensing element and such portion is exposed at the substantially planar surface of the microelectronic element.

10. The assembly of claim 1, wherein a portion of the rear face of the semiconductor region is exposed at the substantially planar surface and the dielectric region is at least substantially co-planar with the portion of the rear face.

11. The assembly of claim 1, further comprising a third light sensing element arranged to receive light of a third wavelength different from the first and second wavelengths through the rear face, wherein the semiconductor region has a third portion having a third thickness between the third light sensing element and the rear face which is greater than the first thickness, such that the third light sensing element is arranged to receive the light having the third wavelength with substantially the same intensity as the first and second light sensing elements are arranged to receive the light of the first and second wavelengths, respectively.

12. The assembly of claim 11, wherein the first, second, and third wavelengths correspond to different colors selected from the group consisting of red, blue, and green.

13. The assembly of claim 12, wherein the first wavelength of light corresponds to green light.

14. The assembly of claim 13, wherein the second wavelength of light corresponds to blue light and the third wavelength corresponds to red light, and wherein the third thickness is more than 5 times the second thickness and the first thickness is at least 1.5 times the second thickness.

15. A system comprising the assembly of claim 1 and one or more other electronic components electrically connected to the assembly.

16. A system as claimed in claim 15 further comprising a housing, the assembly and the other electronic components being mounted to the housing.

17. The assembly of claim 1, wherein the second thickness is zero.

18. The assembly of claim 1, further including a color filter array including at least a first filter and a second filter overlying the first and second light sensing elements, respectively, the first and second filters having first and second different passbands selecting the first and second wavelengths, respectively.

19. The assembly of claim 18, wherein the first and second wavelengths correspond to different ones of: red, blue, or green wavelengths.

20. The assembly of claim 18, further including an array of microlenses including first and second microlenses overlying the first and second filters, respectively.

21. The assembly of claim 20, further including a transparent cover overlying the microlenses, a cavity being disposed between the transparent cover and the microlenses.

22. The assembly of claim 1, further comprising:
a color filter array including at least a first filter and a second filter overlying the first and second light sensing elements, respectively, the first and second filters having first and second different passbands configured to select the first and second wavelengths, respectively;
an array of microlenses including first and second contiguous microlenses overlying the first and second filters, respectively;
a transparent cover overlying the array of microlenses, wherein a cavity is disposed between the transparent cover and the array of microlenses; and
a substrate mounted to the front face of the microelectronic element, the substrate having a coefficient of thermal expansion of less than 10 parts per million/° C. ("ppm/° C."), and conductive elements extending from the contacts of the microelectronic element through the substrate and exposed at a surface of the substrate remote from the microelectronic element, the conductive elements including unit contacts.

23. The assembly of claim 1, wherein the dielectric region includes at least one light guide arranged in the space.

24. The assembly of claim 1, wherein a first opening is disposed in the semiconductor region between the first portion and the rear face and a second opening is disposed in the semiconductor region between the second portion and the rear face, wherein the openings have walls extending generally in a direction between the front and rear faces, have bottom surfaces adjacent the respective portions, and have rounded portions defining continuous transitions between the walls and the bottom surfaces.

25. The assembly of claim 1, further comprising a third light sensing element arranged to receive light of a third wavelength different from the first and second wavelengths through the rear face,
wherein the first portion having the first thickness is disposed between the first and third light sensing elements and the rear face, the first and second thicknesses being selected such that the first, second, and third different wavelengths are able to pass through the first and second thicknesses of the semiconductor region, respectively, and substantially compensate for absorption within the semiconductor region overlying the first, second, and third light sensing elements.

26. A method of making a microelectronic image sensor assembly, comprising:
patterning a rear face of a semiconductor region of a microelectronic element having contacts exposed at a front face of the microelectronic element opposite the rear face, the microelectronic element having substantially identical first and second light sensing elements arranged on a planar circuitry portion of the semiconductor region adjacent the front face, wherein the planar circuitry portion is disposed between the light sensing elements and the front face and is configured to electrically couple the light sensing elements to the contacts, the patterning performed such that the semiconductor region has a first portion having a first thickness overlying the first light sensing element, a second portion having a second thickness less than the first thickness overlying the second light sensing element, the semiconductor region further including a wall portion disposed between the first and second portions of the semiconductor region, the wall portion having a wall thickness overlying a level of the semiconductor region defined by the first and second light sensing elements, the wall thickness being greater than the first and second thicknesses and extending from the planar circuitry portion of the semiconductor portion to the rear face at the thickest portion of the semiconductor region, and the wall portion being continuous and consisting of a single material of the semiconductor region, separate from the light sensing elements, from a first outermost surface of the wall portion closest to the first portion to a second outermost surface of the wall portion closest to the second portion,
the first and second thicknesses being selected such that the light of the first and second different wavelengths are able to pass through the first and second thicknesses of the semiconductor region, respectively, and reach the first and second light sensing elements with substantially the same intensity; and
forming a dielectric region at least substantially occupying a cavity in the semiconductor region overlying at least one of the first or second light sensing elements, wherein the microelectronic element has a substantially planar surface overlying the first and second light sensing elements, and a surface of the dielectric region is exposed at the substantially planar surface.

27. The method of claim 26, further comprising forming an antireflective coating overlying the semiconductor region prior to the step of forming the dielectric region, wherein the dielectric region is formed over at least a portion of the antireflective coating.

28. The method of claim 26, wherein the first and second wavelengths correspond to different colors of light selected from the group consisting of red, blue, and green.

29. The method of claim 26, wherein a portion of the rear face of the semiconductor region is exposed at the substantially planar surface and the dielectric region is at least substantially co-planar with the portion of the rear face.

30. The method of claim 26, wherein the microelectronic element includes a third light sensing element arranged to receive light of a third wavelength different from the first and second wavelengths through the rear face, wherein the step of patterning the semiconductor region is performed such that the semiconductor region has a third portion having a third thickness greater than the first thickness between the third light sensing element and the rear face, such that the third light sensing element is arranged to receive the light having the third wavelength with substantially the same intensity as the first and second light sensing elements are arranged to receive the first and second wavelengths, respectively.

31. The method of claim 30, wherein the first, second, and third wavelengths correspond to different colors selected from the group consisting of red, blue, and green.

32. The method of claim 26, further comprising mounting a substrate to the front face of the microelectronic element, the substrate having a coefficient of thermal expansion of less than 10 parts per million/° C. ("ppm/° C."), and forming conductive elements extending from the contacts of the microelectronic element through the substrate and exposed at a surface of the substrate remote from the microelectronic element, the conductive elements including unit contacts.

33. The method of claim 26, further including providing a color filter array including at least a first filter and a second filter overlying the first and second light sensing elements, respectively, the first and second filters having first and second different passbands selecting the first and second wavelengths, respectively.

34. The method of claim 33, wherein the first and second wavelengths correspond to different ones of: red, blue, or green wavelengths.

35. The method of claim 33, further comprising forming an array of microlenses including first and second microlenses overlying the first and second filters, respectively.

36. The method of claim 35, further comprising mounting a transparent cover overlying the microlenses, a cavity being disposed between the transparent cover and the microlenses.

* * * * *